US012764864B2

(12) United States Patent
Lindahl

(10) Patent No.: US 12,764,864 B2
(45) Date of Patent: Oct. 13, 2026

(54) CURRENT SENSOR FOR A PRINTED CIRCUIT BOARD

(71) Applicant: ALSTOM Holdings, Saint-Ouen-sur-Seine (FR)

(72) Inventor: Martin Lindahl, Solna (SE)

(73) Assignee: ALSTOM Holdings, Saint-Ouen-sur-Seine (FR)

( * ) Notice: Subject to any disclaimer, the term of this patent is extended or adjusted under 35 U.S.C. 154(b) by 225 days.

(21) Appl. No.: 18/290,671

(22) PCT Filed: Jun. 23, 2022

(86) PCT No.: PCT/EP2022/067197
§ 371 (c)(1),
(2) Date: Jan. 19, 2024

(87) PCT Pub. No.: WO2023/001482
PCT Pub. Date: Jan. 26, 2023

(65) Prior Publication Data
US 2024/0237215 A1 Jul. 11, 2024

(30) Foreign Application Priority Data
Jul. 22, 2021 (SE) .................................... 2150966-6

(51) Int. Cl.
*H05K 1/16* (2006.01)
*H05K 1/02* (2006.01)

(52) U.S. Cl.
CPC ........... *H05K 1/165* (2013.01); *H05K 1/0218* (2013.01); *H05K 2201/10151* (2013.01)

(58) Field of Classification Search
CPC ..................... H05K 1/165; H05K 2201/10151
See application file for complete search history.

(56) References Cited

U.S. PATENT DOCUMENTS 5,815,391 A 9/1998 Pelly
2009/0230948 A1 9/2009 Kojovic
(Continued)

FOREIGN PATENT DOCUMENTS

JP H1151975 A 2/1999
JP 2009133783 A 6/2009
(Continued)

OTHER PUBLICATIONS

Cree: "C3M0016120K, Silicon Carbide Power MOSFET, C3MTM MOSFET Technology, N-Channel Enhancement Mode," Apr. 2019, 12 pages.
(Continued)

*Primary Examiner* — Jeremy C Norris
(74) *Attorney, Agent, or Firm* — Brake Hughes Bellermann LLP

(57) ABSTRACT

A current sensor (100) integrated into a printed circuit board (PCB) (102) for sensing a current flow (104) through a first conductive path (106). The current sensor (100) comprises a first conductive winding (110) forming an open shape (112) in a plane of the PCB (102), wherein the open shape (112) has a first end (114*a*) and a second end (114*b*) and delimits a sensitive region (116) in a plane of the PCB (102) for sensing the current flow (104) through the first conductive path (106) arranged within the sensitive region (116). The first conductive winding (110) is formed of a conductor having a plurality of turns extending across a thickness (d) of the PCB (102) and the first conductive winding (110) is spaced from an obstacle (108) in the PCB (102) by at least an insulation distance (118) from the first end (114*a*) to the obstacle (108).

25 Claims, 10 Drawing Sheets

(56) References Cited

U.S. PATENT DOCUMENTS

| | | | |
|---|---|---|---|
| 2014/0210463 A1 | 7/2014 | Klein | |
| 2014/0253108 A1 | 9/2014 | Singh et al. | |
| 2022/0252642 A1* | 8/2022 | Kulkarni ............ | G01R 19/0092 |

FOREIGN PATENT DOCUMENTS

| | | |
|---|---|---|
| JP | 2010008120 A | 1/2010 |
| JP | 2011174769 A | 9/2011 |
| JP | 2012008140 A | 1/2012 |
| JP | 4917183 B2 | 2/2012 |
| JP | 2017504022 A | 2/2017 |
| KR | 101169301 B1 | 7/2012 |
| KR | 101989604 B1 | 6/2019 |
| WO | 2021054559 A1 | 3/2021 |

OTHER PUBLICATIONS

Ming, L. et al.: "Screen-Returned PCB Rogowski Coil for the Switch Current Measurement of SiC Devices," 2019 IEEE Applied Power Electronics Conference and Exposition (APEC), IEEE, 2019, pp. 958-964.

Shi, Y. et al.: "A Review of Traditional Helical to Recent Miniaturized Printed Circuit Board Rogowski Coils for Power-Electronic Applications," IEEE Transactions on Power Electronics, vol. 35, No. 11, Nov. 2020, pp. 12207-12222.

Wang, J. et al. "Integrated Switch Current Sensor for Shortcircuit Protection and Current Control of 1.7-kV SiC MOSFET Modules," 2016 IEEE Energy Conversion Congress and Exposition (ECCE), IEEE, 2016, 7 pages.

Office Action for Swedish Patent Application No. 2150966-6, mailed on Feb. 23, 2022, 7 pages.

International Search Report and Written Opinion for PCT Application No. PCT/EP2022/067197, mailed on Oct. 19, 2022, 9 pages.

Office Action for Japanese Patent Application No. 2024-502568, mailed on May 29, 2026, 16 pages.

* cited by examiner

CURRENT SENSOR FOR A PRINTED CIRCUIT BOARD

CROSS REFERENCE TO RELATED APPLICATIONS

This application is a 35 U.S.C. § 371 National Phase Entry Application from PCT Application No. PCT/EP2022/067197, filed on Jun. 23, 2022, entitled "CURRENT SENSOR FOR A PRINTED CIRCUIT BOARD", and designating the U.S., which in turn claims priority to SE Application No. 2150966-6 filed on Jul. 22, 2021, the disclosures of which are incorporated herein by reference in their entireties.

TECHNICAL FIELD

The present invention relates to sensors for sensing or measuring electrical current, also referred to as current sensors. In particular, the present invention relates to current sensors for integration into a printed circuit board (PCB).

BACKGROUND

Current sensors are employed in a variety of electronics contexts when it is desired to measure the current flow through conductive paths. Desirable characteristics for a current may include a high sensitivity and accuracy, a wide range of operational frequencies (referred to as a 'wide bandwidth'), and a high tolerance to environmental interference, to name a few.

There exist two primary techniques for sensing current flow: shunt resistors and magnetic field sensors.

Shunt resistor sensors include a resistor of known resistance, typically referred to as a 'shunt', electrically connected to a portion of an electrical circuit where a current measurement is desired. By exploiting Ohm's law, the measured voltage drop across the shunt can be used as an indication of the current flow therethrough. However, at high currents heating of the shunt due to high power loss can be high, which can reduce the accuracy of the current sensor. Also, the power loss in itself is a cost and therefore undesirable.

Magnetic field sensors can be used as current sensors because a current flow through a conductive path will generate a magnetic field proportional to the current flow. Such sensors may exploit Faraday's law or the Hall effect when sensing the induced magnetic field. Unlike shunt resistors, it is not necessary to electrically connect magnetic-based current sensors to the components whose current is being measured. Thus, they are preferred in situations where, for example, electrical isolation between components is required, or in high-current applications.

Electronic components being installed in compact or crowded environments in general may not have the requisite space around them for installation of conventional current sensors. Obstacles such as electrical terminals, screws in a PCB, and/or other components may make it difficult to install a current sensor for a component near these obstacles. This is especially true for the context of integrating a current sensor into a PCB.

There have been some attempts to integrate current sensors into printed circuit boards (PCBs). When integrating components into PCBs, miniaturisation of components need to be considered, as PCBs are typically small in size, are becoming smaller as the technology progresses and the human strive for functional density increases.

The physics of some components can change as the components are miniaturised and, thus, miniaturisation may not be as simple as making each element of the component smaller. Furthermore, certain applications requiring the use of PCBs having miniaturised components may not be conducive to the proper functioning of these components across their entire operational range. An example is the increased demand for high bandwidth current sensing when using silicon carbide based semiconductors and utilizing the fast switching characteristics of this type of material. Thus, further changes of the current sensor may be required to ensure proper functioning of a miniaturised component when implemented in a wide range of applications.

Techniques such as 'trace resistance sensing' have been employed as a space-saving configuration of a current sensor, whereby a shunt resistor is replaced by a trace (e.g. copper) in a PCB, having a known intrinsic resistance value. The operation of such a sensor may be enhanced through the use of an isolation amplifier, or other post-processing techniques.

SUMMARY OF THE INVENTION

The present disclosure provides an improved current sensor in terms of accuracy and high-bandwidth for sensing a current flow through a conductive path in a PCB.

According to a first aspect, there is provided a current sensor integrated into a printed circuit board (PCB) for sensing a current flow through a first conductive path. The current sensor comprises a first conductive winding forming an open shape in a plane of the PCB, wherein the open shape has a first end and a second end and delimits a sensitive region in a plane of the PCB for sensing the current flow through the first conductive path arranged within the sensitive region. The first conductive winding is formed of a conductor having a plurality of turns extending across a thickness of the PCB and the first conductive winding is spaced from an obstacle in the PCB by at least an insulation distance from the first end to the obstacle.

The conductive path may be a connective wire, a conductive portion of an electrical component in a PCB, or similar component carrying a current that is desired for sensing. For example, the first conductive path may be a pin or a terminal of an electronic device, such as a semiconductor transistor (i.e., a silicon transistor, a silicon carbide transistor, a high-power semiconductor transistor, or the like).

The first conductive winding is formed of a conductor as a wire (copper, aluminium, or some other electrical conductor material) that winds in a manner so as to have a plurality of turns extending across the thickness of the PCB. The plurality of turns may be comprised in a range of 4 to 100 turns or, preferably, 8 to 32 turns, which may further increase the bandwidth and frequency response of the current sensor.

The conductive path will have circular (or near-circular) magnetic field lines emanating therefrom, thus the turns of the conductive winding are arranged in the PCB so as to enclose at least a portion of these magnetic field lines. That is, viewed from a cross-section taken perpendicular to a length of the conductive winding (i.e. extending between the two ends of the open shape of the winding), the turns of the conductive winding are arranged to collect magnetic flux so that an electromotive force (EMF) is generated in the first conductive winding according to the current flow in the first conductive path (i.e., according to Faraday's law of induction).

The EMF generated in the conductive winding is in turn manifested as a voltage signal across the conductor out of which the conductive winding is formed. In some examples, the first conductive winding is electrically connected to an integrator for generating an output voltage signal indicative of the current flow in the first conductive path. The electrical connection of the integrator may be across electrical terminals, e.g. at either end of the conductor that the conductive winding is formed of. Additionally or alternatively, the voltage signal from the conductive winding may be provided to a processing module which may perform integration by software means. The integration of the voltage signal allows for a current value to be determined since the integrated voltage is proportional to the current. i.e. a measurement of the current value of the current flow through the conductive path.

According to some examples, the conductor out of which the conductive winding is formed may comprise a first electrical terminal and a second electrical terminal, for example at either extreme of the length of the conductor. These two electrical terminals may advantageously be arranged together at the first end or the second end of the open shape of the conductive winding (as viewed in a plane of the PCB). Thus, the electrical terminals may be easily electrically connected to other components (e.g. an integrator, as discussed above).

To achieve this, the second electrical terminal may be returned, along the shape of the conductive winding to the same end as the first terminal. Thus, the current sensor stays compact in its construction and the obstacle can be avoided when electrical connection across the terminals is required, whilst cancelling magnetic fields (i.e., interference) in the z-direction.

The first conductive winding forms an open shape in the plane of the PCB, having a first end and a second end. The open shape may be any suitable open shape for delimiting a sensitive region that encloses the conductive path, whilst allowing at least an insulation distance from the first end to an obstacle in the PCB. For example, the open shape may be an arc, such as an elliptical or circular arc (i.e. any portion of a circle or ellipse apart from a complete circle or ellipse), or a U-shape (with a curved base or a flat base), or any open polygon (which may also be referred to as a piece-wise linear shape) such as an open rectangle or octagon. The open shape is formed in a plane of the PCB at least in a sense that, when viewed from above or below the PCB, the first conductive winding has an axis (e.g. along its length) that is arranged so as to form said open shape. The open shape may be further formed through an extension in the plane of the PCB (e.g. as a width or thickness of the shape), so as to, for example in the case of an arc, form a sector of an annular circle when viewed from above or below. That is, this open shape is formed in a plane of the PCB such that the shape is formed irrespective of the internal architecture of the first conductive winding, e.g. irrespective of the turns extending across the thickness of the PCB. The open shape can be optimised for maximal magnetic flux collection, case of manufacture, avoidance of the obstacle, and/or other desirable characteristics.

The sensitive region delimited by the open shape of the first conductive winding is the region through which a current flow may pass to cause an EMF to be generated. i.e. the region in which a current flow through a conductive path can be sensed. The current sensor is arranged near enough to the conductive path so that the current flow therethrough can be sensed. Preferably, the conductive winding of the current sensor is shaped for maximal collection of the magnetic flux generated by the current flow.

The current sensor advantageously has an open shape such that it may be spaced from (i.e., avoid) an obstacle in the PCB. According to some examples, the obstacle may be a mechanical obstacle such as a fastening or attachment point on the PCB (a screw, peg, fixing, etc.) or an end or break in the PCB (e.g. a gap or a through-hole machined into the PCB or simply the end border thereof).

According to some examples, the obstacle may be a second conductive path having an electrical potential different from the electrical potential of the first conductive path. In these examples, the insulation distance may correspond to a distance from the first end to the second conductive path for preventing electrical interference between the second conductive path and the first conductive winding. As the accuracy of the current sensor depends on the ability of the conductive winding to collect magnetic flux generated by the current flow, it is preferable that magnetic flux or other electromagnetic signals do not cause electrical interference in the conductive winding, as this would affect the output voltage signal and thus the accuracy of the measured current. Moreover, if the second conductive path has a different potential to the first conductive path, there is a potential risk of electrical arcing. Other forms of electrical interference include leakage current and/or material deterioration over the course of the current sensor's lifetime.

In examples where the obstacle is a second conductive path, the current sensor can be arranged such that magnetic flux emanating from a current flow through the second conductive path does not substantially influence the measured current value from the current sensor. For example, the first end and the second end may define an opening axis passing through the first end and the second end, and a midpoint on the axis between the first end and the second end. The opening axis may be thought of as a line bridging the opening portion of the open shape of the conductive winding. The first end and the second end of the open shape may be arranged relative to the second conductive path such that an axis perpendicular to the opening axis and passing through the midpoint coincides with a location of the second conductive path. In this way, all (or most) of the magnetic field lines that pass through the turns of the conductive winding in one direction (thereby causing an EMF) will subsequently pass through the turns of the conductive winding in a (near-)opposite direction, thereby causing another EMF substantially cancelling out the first EMF. It will be appreciated that, although 'exactly perpendicular' may be ideal, there may be some deviation from exact perpendicularity without substantial detriment to the accuracy of the measured current value.

In some examples, a further technique for reducing interference in the conductive winding is to protect the conductive winding using shielding. For example, a shielding material may be arranged at least partially shielding the first conductive winding from an electromagnetic source other than the current flow in the first conductive path. Thus, the accuracy of the current sensor can be further improved in this way.

According to some further examples, the shielding material may form at least part of an electrical return from the first electrical terminal to the second electrical terminal. That is, the shielding material may be a conductive material and form part of the conductive path between the first electrical terminal and the second electrical terminal of the conductive winding so as to assist in allowing for the first electrical terminal and the second electrical terminal to be arranged together.

The insulation distance from the obstacle is the minimum distance from the first end of the conductive winding (that is, the first end of the shape formed by the conductive winding) to the obstacle. By arranging the end of the conductive winding in this way, a maximal magnetic flux and closest proximity to the current flow can be achieved whilst not being obstructed by the obstacle. Hence, an improved accuracy of the current sensor can be achieved. The insulation distance from the first end to the obstacle may be equal to the insulation distance from the second end to the obstacle, or it may be different.

The insulation distance can be used to insulate the conductive winding from the obstacle, for example if the obstacle is a conductor that does or does not have an electrical potential. Insultation along the insulation distance to achieve sufficient clearance and creepage distances may be provided by at least one of PCB material (that is, the material out of which the PCB is formed), air, and insulation material (such as conformal coating, plastic, rubber, or other insulators), arranged between the first conductive winding and the obstacle.

According to a second aspect, there is provided a method for integrating a current sensor into a PCB for sensing a current flow through a first conductive path. The method comprises arranging a first conductive winding into an open shape in a plane of the PCB, wherein the open shape has a first end and a second end and defines a sensitive region in the plane of the PCB for sensing the current flow through the first conductive path arranged within the sensitive region. The first conductive winding is formed of a conductor having a plurality of turns extending across a thickness of the PCB and the first conductive winding is spaced from the obstacle by at least an insulation distance from the first end to the obstacle.

In some examples, the method further comprises determining, prior the arranging, the insulation distance, based at least in part on a magnitude of the current flowing through the first conductive path; a size of the obstacle; a potential difference between the first conductive winding and the obstacle; a potential difference between the first conductive winding and the first conductive path; a potential difference between the first conductive path and the obstacle; and/or a material of which an insulation material consists (as discussed above).

In some examples, the current sensor may employ an electronic integrator, or a signal processing module may be used instead. In this latter case, the method may further comprise receiving, from the current sensor, a sensor signal; and determining, by a signal processing module and based at least in part on the sensor signal, a current measurement for the current flow.

According to a third aspect, there is provided a system comprising a first current sensor, a second current sensor and a signal processing module. The first current sensor is integrated into a first PCB for sensing a first current flow through a first conductive path, and the second current sensor is integrated into a second PCB for sensing a second current flow through a second conductive path. These current sensors are the same or similar to those described above in respect of the first or second aspects of the present disclosure. The signal processing module is provided for processing sensor signals from the first current sensor and the second current sensor. The signal processing module is configured to generate a current measurement for the first current flow based at least in part on a sensor signal from the second current sensor.

According to some examples, a first sensitive region of the first current sensor is arranged to collect a first magnetic flux induced by a first current flow; and a second sensitive region of the second current sensor is arranged to collect a second magnetic flux induced by a second current flow. Some magnetic flux originating from the second current flow may be collected by the first conductive winding to produce a net EMF contribution (i.e. it may not cancel out). In such examples, the signal output from the second current sensor can be taken into account when determining the magnitude of the first current flow, to improve the measurement accuracy. The same applies for the influence of the first current flow on the second current sensor. In some examples, taking into account the signal output from the second sensor may comprise a further consideration of a known distance between the first and second current flows, an error on the first or second sensor signals, or the like.

Additionally or alternatively, the second current flow through the second conductive path may be controlled according to a control signal (i.e. comprised in the sensor signal), and the signal processing module may be further configured to generate a current measurement for the first current flow based at least in part on the control signal. The control signal may be used also in cases where the second conductive path does not have an installed current sensor.

The two system concepts described in the two paragraphs above may be used individually or together to improve the accuracy of the current sensors.

Instead of trying to shield a first current sensor from electromagnetic interference caused by a second current flow, the voltage signal induced thereby may be taken into account by the signal processing module so that the current sensors may mutually compensate for the magnetic flux induced by other current flows. The processing may take into account known characteristics of one or both of the current flows, or signal processing methods may be applied to the voltage signals so as to remove the contributions from current flows other than the current flow associated with a given current sensor.

Although the terms “first” and “second” have been used, the first obstacle and the second obstacle may be the same obstacle, and/or the first PCB and the second PCB may be portions of a same PCB.

As discussed above, the conductive paths may be pins of electronic devices. For example, the first conductive path may be a pin of a first electronic device and the second conductive path may be a pin of a second electronic device. The first electronic device and the second electronic device may then be electrically connected via the PCB if the first PCB and the second PCB are portions of the same PCB.

In some examples, the first current sensor and the second current sensor may be arranged symmetrically. For example, the first PCB and the second PCB may be arranged in parallel planes, and the first current sensor and the second current sensor may be arranged symmetrically about a plane parallel to the first PCB and the second PCB. Alternatively, the first PCB and the second PCB may be portions of a same PCB, and the first current sensor and the second current sensor may be arranged symmetrically about a plane perpendicular to the PCB.

According to a fourth aspect, there is provided a motor converter for a rail vehicle driveline comprising one or more transistors, each having at least one pin, and at least one current sensor, the same as or similar to the aforementioned current sensors, arranged for sensing a current flow through the at least one pin of said one or more transistors.

BRIEF DESCRIPTION OF THE DRAWINGS

One or more embodiments will be described, by way of example only, and with reference to the following figures (which should not be considered as being to scale), in which.

Figure 1A:
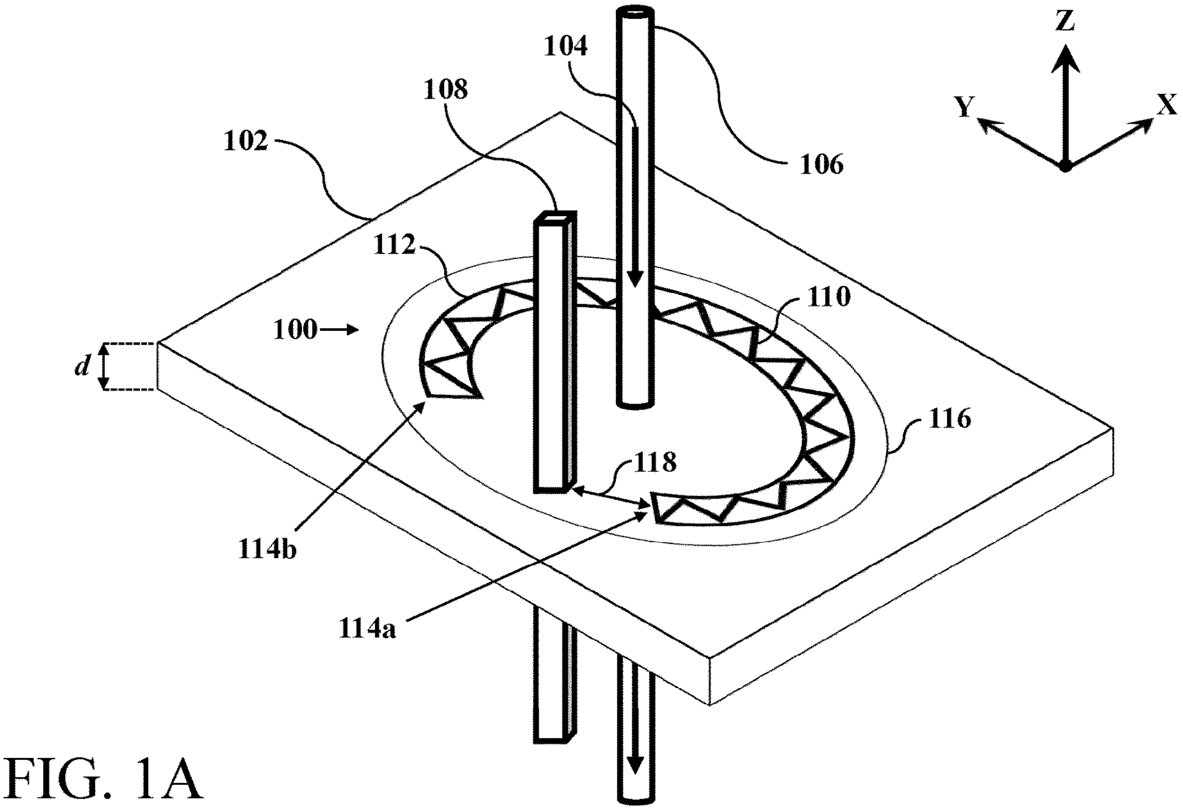
FIG. 1A schematically shows a current sensor integrated into PCB from a perspective view, according to an embodiment of the present disclosure.

Whilst the invention is susceptible to various modifications and alternative forms, specific embodiments are shown by way of example in the drawings as herein described in detail. It should be understood, however, that the detailed description herein and the drawings attached hereto are not intended to limit the invention to the particular form disclosed. Rather, the intention is to cover all modifications, equivalents, and alternatives falling within the scope of the appended claims.

Any reference to prior art documents or comparative examples in this specification is not to be considered as an admission that such prior art is widely known or forms part of the common general knowledge in the field.

As used in this specification, the words “comprise”, “comprising”, and similar words are not to be interpreted in the exclusive or exhaustive sense. In other words, they are intended to mean “including, but not limited to”.

DETAILED DESCRIPTION

The present invention is described in the following by way of a number of illustrative examples. It will be appreciated that these examples are provided for illustration and explanation only and are not intended to be limiting on the scope of the present invention. Instead, the scope of the present invention is to be defined by the appended claims. Furthermore, although the examples may be presented in the form of individual embodiments, it will be recognised that the invention also covers combinations of the embodiments described herein.

FIG. 1A schematically shows a current sensor integrated into a printed circuit board (PCB) from a perspective view, according to an embodiment.

As illustrated in FIG. 1A, there is shown a current sensor (generally indicated as 100) integrated into a PCB 102 having a thickness d. The current sensor 100 is arranged for sensing a current flow 104 through a conductive path 106. The conductive path 106 is illustrated as extending either side of the PCB 102 for case of illustration although the conductive path 106 may instead only extend across the thickness d of the PCB 102 or a portion thereof.

The conductive path 106 is shown being proximate to an obstacle 108 in the PCB 102. As with the conductive path 106, the obstacle 108 is shown as extending either side of the PCB 102, although the obstacle 108 may instead only extend across the thickness d of the PCB 102 or a portion thereof. In essence, the obstacle 108 (which may also be thought of as an obstruction, impediment, blockage, etc.) restricts the spatial placement of a current sensor. However, the current sensor 100, and in particular the shape of the conductive winding 110 thereof, allows for measurement of the current flow through the conductive path 106 despite the presence of the obstacle 108.

The obstacle 108 may be an inert or benign obstacle such as a mechanical obstacle like a plastic attachment screw in the PCB 102 or a through-hole in the PCB 102, thus restricting the ability to install the current sensor 100 in the proximity of the obstacle 108.

The obstacle 108 may also be a further conductive path (e.g. a neighbouring pin of an electronic device, a connective wire or trace in the PCB 102 that does or does not carry current, or the like).

The current sensor 100 comprises a conductive winding 110, which is visible in the figure for the purposes of illustration but may be obscured from visibility by one or multiple layers above and/or below the current sensor within the PCB 102, a shielding material, and/or some other component or element. As discussed further below, the conductive winding is formed of a conductor having a plurality of turns extending across a thickness d of the PCB (i.e., the entirety of the thickness d or a portion thereof).

As shown in FIG. 1A, the conductive winding 110 forms an open shape 112 in a plane (i.e., the XY plane according to the illustrated axes) of the PCB 102. Although the open shape 112 has been shown as a solid line bounding the conductive winding 110, this is purely illustrative and this outline may not be visible. That is, the open shape 112 is formed by the arrangement of the conductive winding 110. As the conductive winding 110 has been arranged to form an elliptical arc around the conductive path 106, the open shape 112 in the case of FIG. 1A is thus an elliptical arc. However, the open shape 112 may be any open shape such as an arc, a circular arc, a U-shape (e.g. having a curved or flat base), a straight line, an open polygon such as an open rectangle or an open octagon, or some other open shape, as discussed in more detail below. The open shape 112 may be further formed by an extension in the plane of the PCB 102 (i.e., providing a thickness or a width) so as to, for example in the case of an arc, form a sector of an annular circle when viewed from above or below.

The open shape 112 has a first end 114*a* and a second end 114*b* (the term ‘end’ having no relevance to the electrical terminals of conductor forming the conductive winding 110). The open shape 112 does not have line segments that meet, and the open shape 112 does not start and end at the same point. Thus, the first end 114*a* of the open shape 112 is in a different physical position on the PCB 102 as the second end 114*b* of the open shape 112, separated by the obstacle 108.

Advantageously, the conductive winding 110 forms an open shape 112 having an opening (defined by a spacing between the first end 114*a* and the second end 114*b*) that may be arranged to coincide with the obstacle 108. As shown in FIG. 1A, the current sensor 100 (specifically the conductive winding 110 thereof) is spaced from the obstacle 108 in the PCB 102 by at least an insulation distance 118 from the first end 114*a* to the obstacle 108.

This arrangement allows for the conductive winding 110 of the current sensor 100 to be shaped for optimal magnetic flux collection, case of manufacturing, minimal use of materials, etc. whilst taking into account the spatial limitations imposed by the obstacle 108.

The open shape 112 formed by the conductive winding 110 delimits a sensitive region 116. The sensitive region 116 is the region in which a magnetic flux generated by a current flow (e.g. current flow 104) flowing through the conductive path 106 may be reliably sensed so as to generate a measurement of the current flow through the conductive path 106. Thus, the sensor is arranged in the PCB with the conductive path 106 located within the sensitive region 116 so that the current flow 104 can be sensed by the current sensor 100.

The discussion here takes place in the context of the plane of the PCB 102 (i.e., the XY plane), however the sensitive region 116 may be three-dimensional (3D). Thus, the illustrated sensitive region 116 in FIG. 1A can be thought of as the projected cross-section through the illustrated surface of the PCB 102 of this 3D shape. This is the same abstraction when discussing the open shape 112 of the conductive winding 110. That is, open shape 112 illustrated is a projection of the boundary of the conductive winding 110 (which may also be thought of as an illustration of the shape along which an extended axis of the conductive winding 110 has been arranged). However, the true shape of the conductive winding 110 may be 3D as it extends through a thickness d of the PCB 102.

It will be appreciated that, whilst the present discussion pertains to an orthogonal arrangement (e.g. the conductive path and the obstacle are aligned with the Z-axis), the presently disclosed techniques may equally be applied to arrangements wherein, for example, the conductive path 106 or the obstacle 108 are not aligned with the Z-axis. In such situations, the insulation distance 118 may be determined along another direction. e.g. from a closest approach of the obstacle 108 and the conductive winding 110.

Figure 1B:
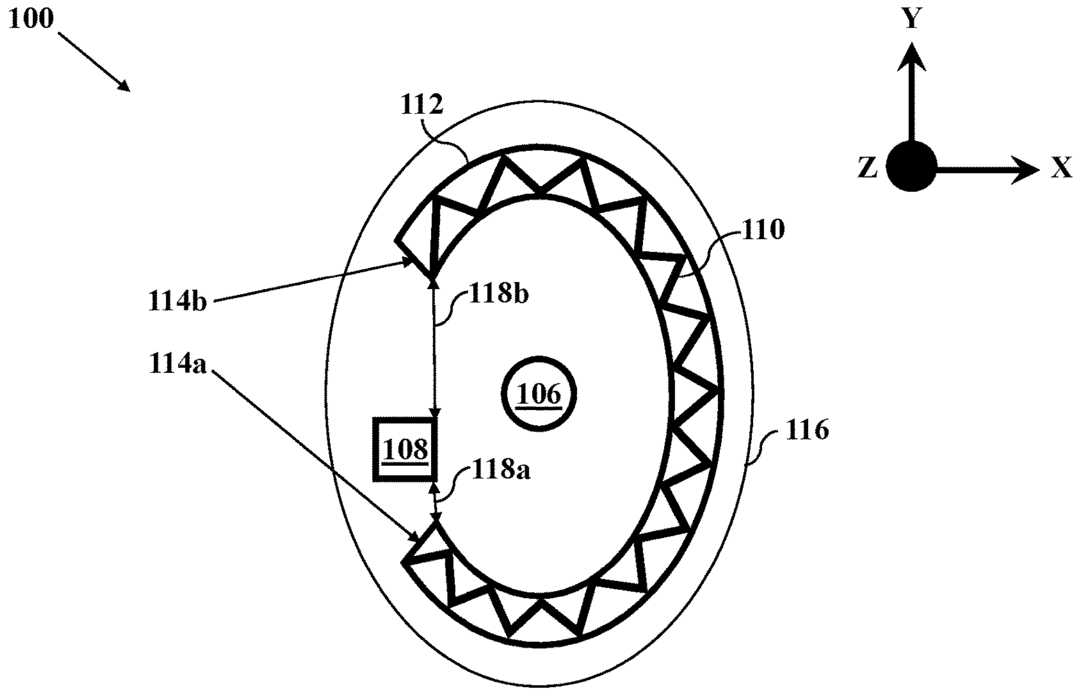
FIG. 1B schematically shows the current sensor of FIG. 1A viewed in the plane of the PCB.

FIG. 1B schematically shows the current sensor of FIG. 1A viewed in the plane of the PCB, from above (i.e. Z-axis is 'coming out of page'). The PCB 102 is not shown.

As shown in FIG. 1B, the insulation distance 118*a* between the first end 114*a* to the obstacle 108 is less than the insulation distance 118*b* from the second end 114*b* to the obstacle 108. However, the insulation distance 118*a* may be greater than, or equal to, the insulation distance 118*b*.

It may be advantageous to make the insulation distance 118*a* equal to the insulation distance 118*b* if there is some minimum spacing required from the obstacle 108 for proper function of the current sensor 100. In this way, a maximal enclosure of the conductive path 106 within the open shape 112 of the conductive winding 110 may be achieved, thus increasing the sensitivity, accuracy, and/or resistance to external interference of the current sensor 100.

Figure 1C:
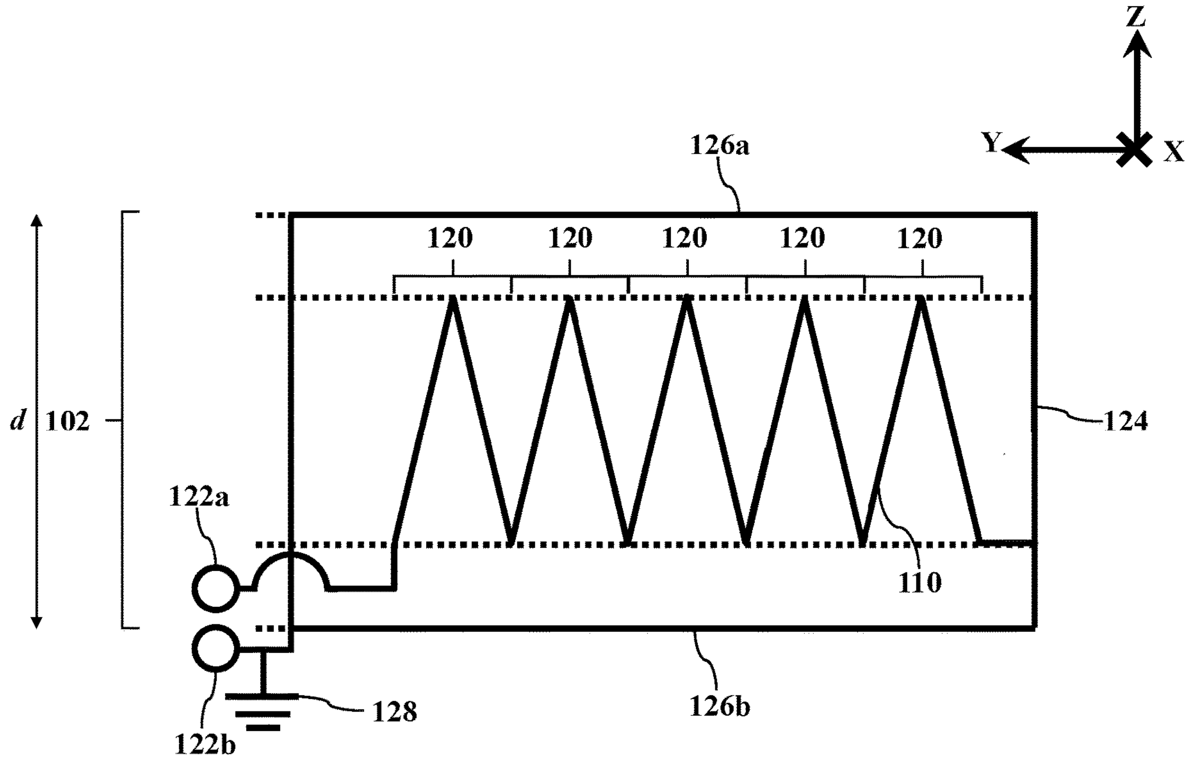
FIG. 1C schematically shows a configuration of the conductive winding of the current sensor of FIG. 1A viewed as a cross-section through the PCB.

FIG. 1C schematically shows the current sensor of FIG. 1A viewed as a cross-section through the PCB. The cross-section has been taken at a portion of the conductive winding 110 aligned with the Y-direction (e.g. the far-right portion in FIG. 1B).

As mentioned above, the conductive winding 110 is formed of a conductor having a plurality of turns 120 extending across a thickness d of the PCB 102. For illustrative purposes, approximately 5 turns 120 have been shown. However, the plurality of turns 120 may be comprised within a range of 4 to 100 turns. Fewer turns 120 in the conductive winding 110 may allow for a greater bandwidth of the current sensor 100, and/or a better frequency response, however there is less capacity for magnetic flux collection. An advantageous trade-off of these factors may be achieved by using a plurality of turns 120 within a range of 8 to 32 turns.

As discussed above, the turns 120 of the conductive winding 110 will enclose some space (i.e. in the X-Z plane) so as to allow the passage of magnetic field lines therethrough.

The PCB 102 illustrated in FIG. 1C has four layers (each schematically shown as a dotted line), although the PCB 102 may have more or fewer layers. The turns 120 of the conductive winding 110 extend from the second layer to the third layer of the PCB 102 in this illustrated example (numbered from the bottom-up), and the conductor out of which the conductive winding 110 is formed has a first electrical terminal 122*a* and a second electrical terminal 122*b*.

Furthermore, in the illustrated example, there is an electrical return loop 124 provided between the first and fourth layers of the PCB 102 for returning the second electrical terminal 122*b* to be arranged together with the first electrical terminal 122*a*. In some examples, these terminals 122*a* and 122*b* may be arranged together at the first end 114*a* or the second end 114*b* of the conductive winding 110.

There are also shielding material (shown as upper shielding portion 126*a* and lower shielding portion 126*b* but generally referred to as shielding material 126 in the following text) shown in FIG. 1C. The shielding material is provided for at least partially shielding the conductive winding 110 from an electromagnetic source other than the current flow 104 in the conductive path 106. In the illustrated example, the shielding material 126 is arranged in the first and fourth layers of the PCB 102, i.e. the top and the bottom layers of the PCB 102 as shown. However, it will be appreciated that other layers may be used. Furthermore, it will be appreciated that the shielding material 126 may additionally or alternatively be arranged extending across a thickness d of the PCB 102 so as to provide shielding to the conductive winding 110 from other directions (e.g. along the X-axis).

The shielding material 126 may be a conductive material, and may be thought of as a 'screen' that screens out electromagnetic interference that would otherwise be incident upon the conductive winding 110 and cause, e.g., inaccuracies in a resulting current measurement from the current sensor 100. In order to assist with the shielding/screening capabilities of the shielding material 126, the portions 126*a* and 126*b* of the shielding material 126 may be electrically connected to each other and/or a grounding connection 128.

In some examples, such as that illustrated, the shielding material 126 may form at least part of an electrical return from the first electrical terminal 122*a* to the second electrical terminal 122*b*. This may advantageously allow for an installation of the current sensor 100 into a PCB 102 with fewer layers, whilst maintaining an improved resistance to external electromagnetic interference. In such examples, the shielding material 126 is advantageously electrically conductive, and may be formed from the same conductor as the conductive winding 110.

Figure 1D:
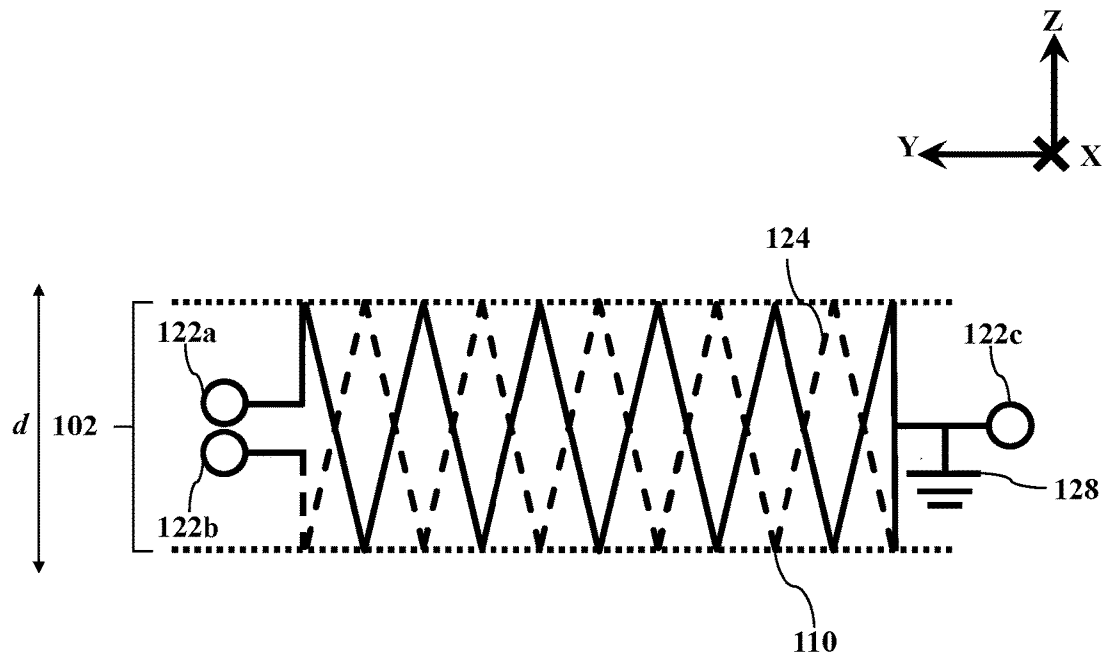
FIG. 1D schematically shows another configuration of the conductive winding of the current sensor of FIG. 1A viewed as a cross-section through the PCB.

FIG. 1D shows an alternative configuration of the conductive winding 110, wherein the return loop 124 is formed along a similar path as the primary loop of the conductive winding 110. The return loops 124 shown in FIGS. 1C and 1D cancel magnetic fields (interference) in the z-direction, and the configuration shown in FIG. 1D may realise a further reduction in space taken up in the PCB 102 (e.g. in terms of layers and/or thickness etc.).

Figure 2:
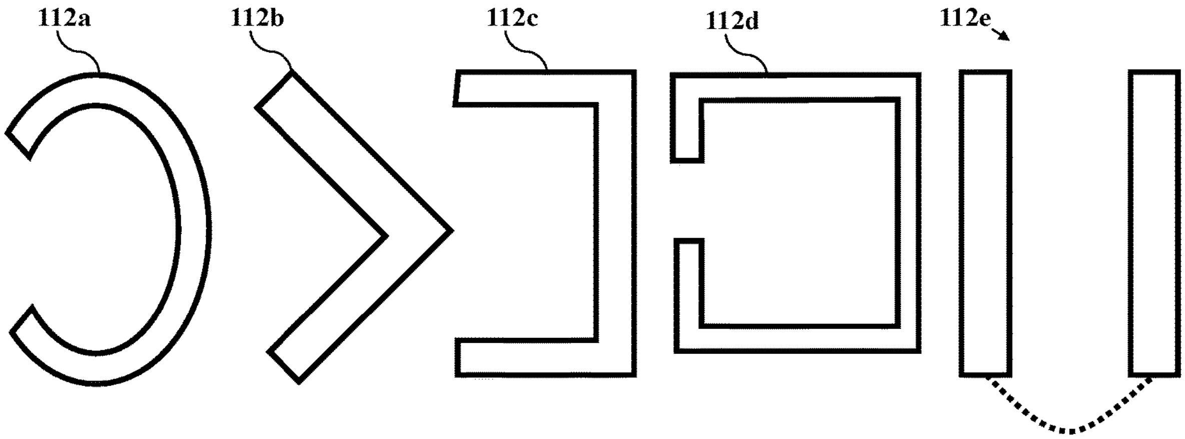
FIG. 2 shows a variety of open shapes (including arc shapes) viewed in the plane of a PCB, according to example implementations.

FIG. 2 shows a variety of open shapes 112 viewed in the plane of a PCB 102, according to example implementations.

As discussed above, the open shape 112 of the conductive winding 110 may be thought of as the spatial boundary of its arrangement in the PCB 102, as viewed as a projection to the plane of the PCB 102 (i.e. from above the PCB or below the PCB). Thus, the open shapes 112 illustrated in FIG. 2 may not be structural elements but may instead indicate the general arrangement of a conductive winding 110 in the plane of a PCB 102.

A first example of an open shape 112 is an arc 112*a*, which is an elliptical arc. The arc 112*a* may instead be a circular arc. Ideal magnetic field lines emanating from a current-carrying conductive path have circular paths. Thus, a circular arc may advantageously collect a greater amount of magnetic flux from, for example, a concentrically arranged conductive path (such as conductive path 106) having current flowing therethrough (such as current flow 104).

A further example of an open shape 112 is an L-shape 112*b*, which may be thought of as two straight lines joined at an angle (i.e., a right angle or some other angle). Alternatively, the open shape 112 may be a U-shape 112*c* e.g. having a flat-bottom, which may be thought of as three straight lines joined at angles. An extension of this concept would be a rectangular box shape having a portion removed therefrom so as to create an open shape 112 (i.e. an open rectangle being an example of an open polygon). Any or all of these lines may alternatively be curved.

The open shape 112 may instead be formed of a straight line 112*d* or two straight lines 112*d* (so as to form an 'equals sign' arrangement if arranged in parallel). The straight lines 112*d* may be individually connected to integrators and/or may be electrically connected to each other by a connecting wire or trace (as indicated by the dotted line) so as to form a single current sensor.

Arranging the conductive winding 110 in a form including straight lines may substantially simplify construction of the current sensor 110. It may further simplify construction for joining angles between straight lines to be right angles.

Although a broadly consistent width of the conductive winding 110 has been illustrated, it may be necessitated by spatial constraints, construction considerations, or other motivations to vary the width (i.e. vary the size of the turns along the length of the conductive winding 110).

Figure 3:
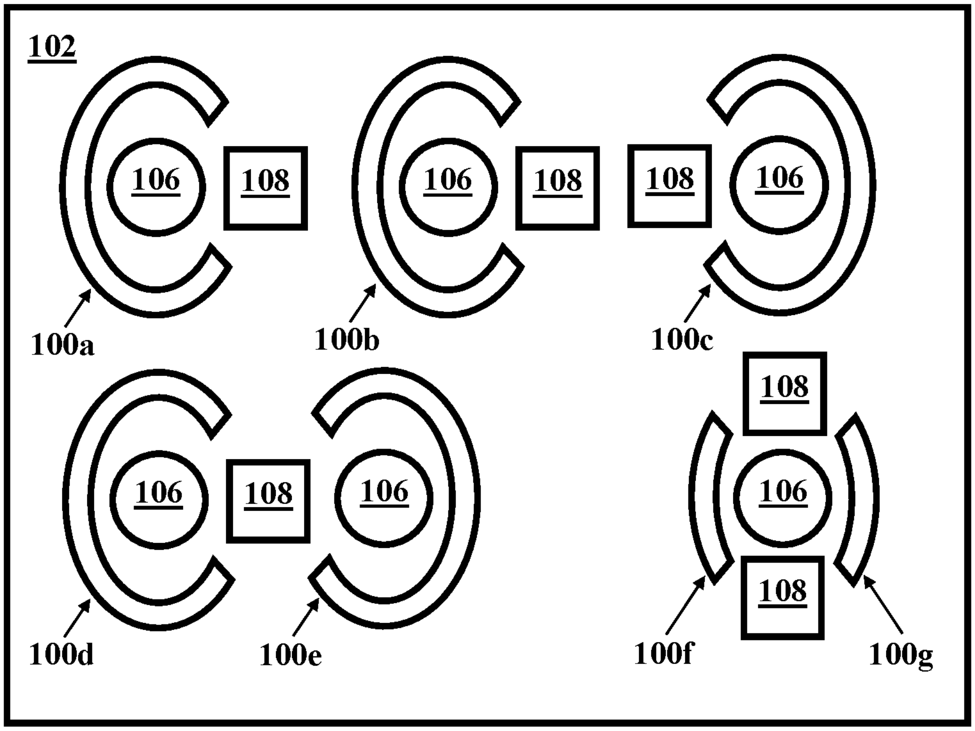
FIG. 3 shows a variety of arrangements of current sensors and obstacles viewed in the plane of a PCB, according to example implementations.

FIG. 3 shows a variety of arrangements of current sensors 100*a-g*, conductive paths 106, and obstacles 108 viewed in the plane of a PCB 102, according to example implementations.

For the purposes of illustration, the current sensors 100*a-g* have been represented by the open shapes defined by their conductive windings, in this example arcs.

Current sensor 100*a* is arranged so as to at least partially surround or enclose the conductive path 106, although the size or shape of the sensitive region delimited by the shape of the conductive winding may not require this, as long as the conductive path 106 is arranged so that the magnetic field lines originating from the current flow 104 pass therethrough. The current sensor 100*a* is proximate an obstacle 108. The opening of the current sensor 100*a* is arranged so that the first and second end of the open shape have an equal insulation distance from its proximate obstacle 108. It can be seen in FIG. 3 that the open shape advantageously avoids the obstacle 108.

Current sensors 100*b* and 100*c* are arranged symmetrically in the plane of the PCB 102. Current sensors 100*a* and 100*d* are also arranged symmetrically in the plane of the PCB 102.

Current sensors 100*d* and 100*e* are also arranged symmetrically in the plane of the PCB 102, being arranged to measure current flow through different conductive paths 106 but having the same obstacle 108 proximate thereto.

Current sensors 100*f* and 100*g* are also arranged symmetrically in the plane of the PCB 102, being mutually proximate to two obstacles 108 but arranged to measure current flow through the same conductive path 106. Thus, although the obstacles 108 proximate current sensors 100*f* and 100*g* prohibit the installation of current sensors 100 having a complete or surrounding shape, multiple current sensors (e.g. 100*f* and 100*g*) may be arranged to individually measure the same current flow through a conductive path 106.

It will be appreciated that symmetry in the plane of the PCB 102 includes a plane of symmetry along. e.g., any of the X-, Y-, and Z-directions as defined in previous figures. Furthermore, although the current sensors 100*a-g* have all been shown installed/arranged on the same PCB 102, the current sensors 100*a-g* may instead be installed/arranged on separate PCBs, e.g. spatially fixed at least relative to each other.

A symmetrical arrangement of current sensors (that is, the shapes of the conductive windings are substantially symmetrical in some plane parallel or perpendicular to the plane of the PCB) allows for a predictable or balanced influence of magnetic flux from a conductive path through one current sensor relative to that from a conductive path through another current sensor. Thus, interference from other current flows may be readily accounted for and removed from a measured current signal/value.

In some examples, a first sensitive region of the first current sensor (e.g. 100*a*) is arranged to collect a first magnetic flux induced by a first current flow, and a second sensitive region of the second current sensor (e.g. 100*d*) is arranged to collect said first magnetic flux. A signal processing module may then be employed to process signals from both current sensors 100*a* and 100*d* so as to generate a value/signal for the current flow through the conductive path associated with current sensor 100*a*, and vice versa.

According to further examples, the first current flow through the first conductive path 106 may be controlled according to a control signal. For example, the first conductive path 106 may be the pin of a semiconductor transistor. This represents an example situation whereby a semiconductor transistor is used as a switch controlled by a voltage on the gate pin. In such cases, it may be advantageous to measure a current flow through a pin carrying the main current of the transistor (drain, source, collector, emitter, or similar, depending on the type of transistor) so that the resulting current from the switching of the semiconductor transistor may be determined.

In this specific example, the control signal may be fed into a signal processing module such that the signal processing module is further configured to generate a current measurement for the second current flow (e.g. a pin of a neighbouring transistor switch) based at least in part on the control signal for the first current flow. For example, the magnetic influence of the nearby current flow may be estimated based at least in part on said control signal, or the obtaining of the current measurement for the second current flow may be timed when the control signal indicates that the first current flow is off (i.e. current is not flowing through the first conductive path) and so it is anticipated that there will be no electromagnetic interference in the current measurement.

It is also possible to arrange a current sensor relative to a nearby conductive path 106 that is expected to generate an interfering magnetic field so as to mitigate the interference therefrom, thus mitigating the requirement for shielding material or other techniques (e.g. signal processing) for reducing interference.

Figure 4:
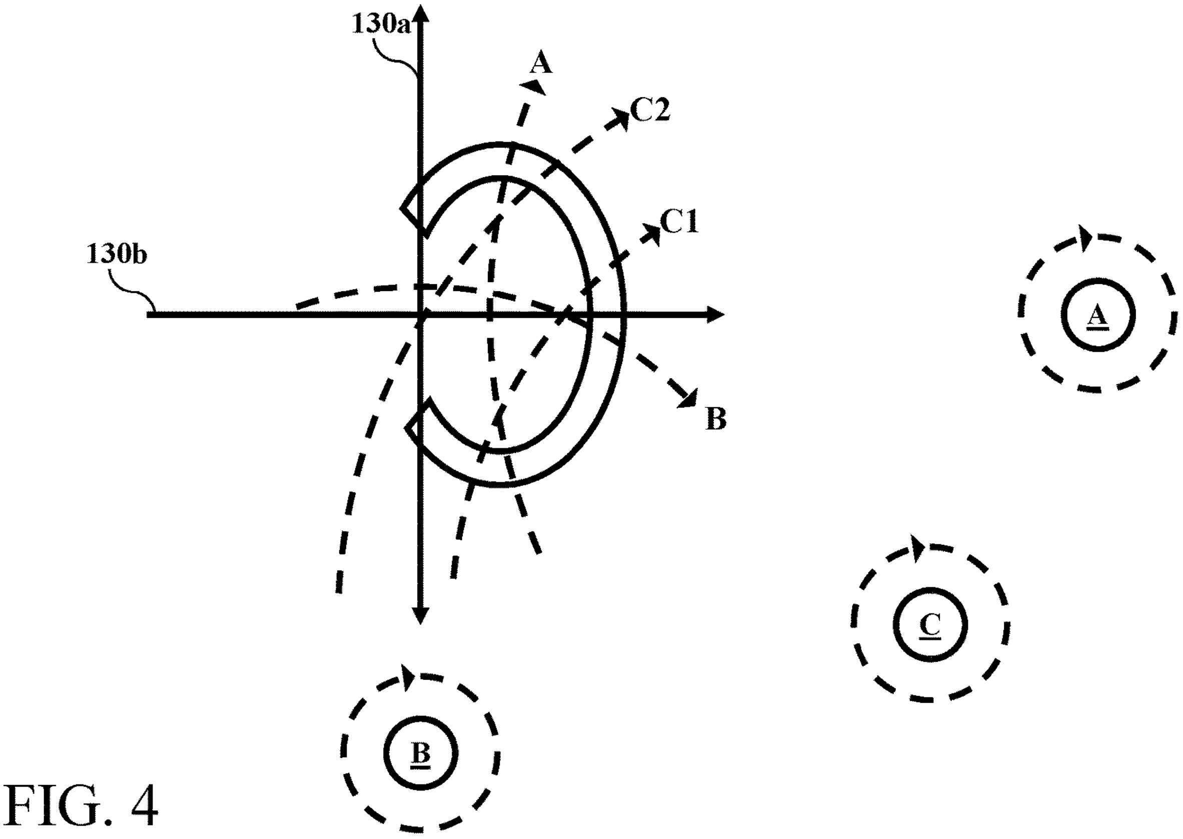
FIG. 4 shows a variety of arrangements of conductive paths and a current sensor, viewed in the plane of a PCB, according to example implementations.

FIG. 4 shows a variety of arrangements of conductive paths A-C and a current sensor (again indicated by an arc shape), viewed in the plane of a PCB (not shown), according to example implementations.

The open (arc) shape of the current sensor has a first end and a second end as in the foregoing description. The first end and the second end define an opening axis 130*a* passing through the first end and the second end, and a midpoint on the axis 130*a* between the first end and the second end. Also illustrated is an axis 130*b* perpendicular to the opening axis 130*a* and passing through the midpoint.

Three example conductive paths A, B, and C (into the page) are shown, and the dotted lines are their resultant magnetic fields. Conductive path A is substantially aligned with the axis 130*b*, conductive path B is substantially aligned with the axis 130*a*, and conductive path C is somewhere therebetween.

As can be seen in FIG. 4, all of the magnetic field lines from A (also labelled as A) may enter (i.e. from below) and leave the conductive winding (i.e. at the top), so that the EMF contribution from current path A is cancelled out.

Most of the magnetic field lines from B (also labelled B) only cross once through the conductive winding, so that the contribution from conductive path B does not cancel out.

Conductive path C is somewhere between A and B, but it can be seen that some field lines (e.g. C1) will cancel out, whilst others (e.g. C2) will not. It is thus seen that an advantageous placement of the current sensor opening relative to a nearby conductive path, having a current flow, is along an axis approximately half-way between the ends of the opening, i.e., the first end and the second end are arranged relative to the nearby conductive path A such that an axis 130*b* perpendicular to the opening axis 130*a* and passing through the midpoint coincides with a location of the conductive path A.

Figure 5:
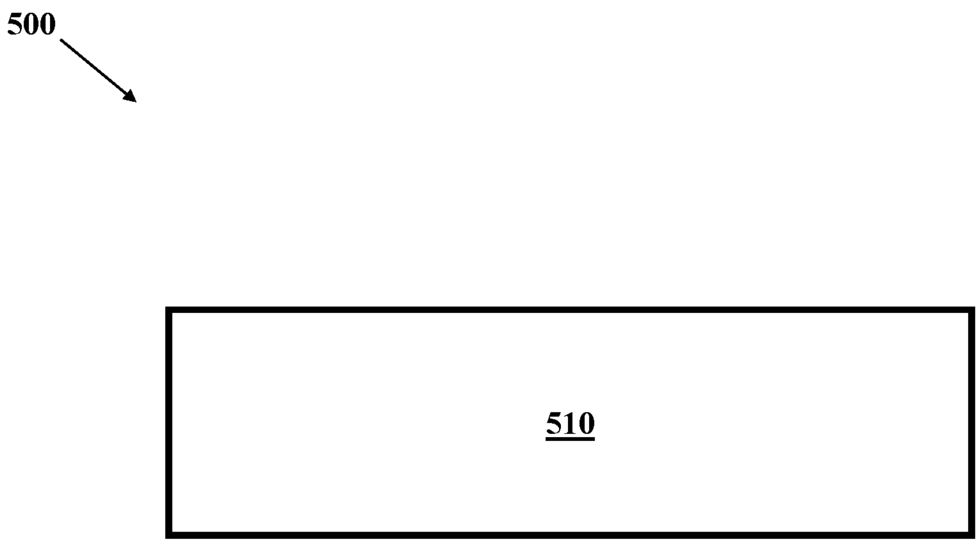
FIG. 5 schematically shows a method for integrating a current sensor into a PCB, according to an embodiment of the present disclosure.

FIG. 5 schematically shows a method 500 for integrating a current sensor into a PCB, according to an embodiment of the invention.

The method 500 includes arranging a first conductive winding into an open shape in the plane of the PCB, as indicated by the block 510.

According to this method 500, the open shape has a first end and a second end and defines a sensitive region in the plane of the PCB for sensing the current flow through the first conductive path arranged within the sensitive region. Furthermore, the first conductive winding is formed of a conductor having a plurality of turns extending across a thickness of the PCB, and the first conductive winding is spaced from an obstacle in the PCB by at least an insulation distance from the first end to the obstacle.

The method 500 may further include determining, prior the arranging, the insulation distance, for example, with a view to minimize the insulation distance and/or maximize the capacity of the current sensor to collect magnetic flux emanating from the current flow.

This determination may be based on a magnitude of the current flowing through the conductive path as, for example, this may affect how far from the conductive path the conductive winding may still be able to sense the magnetic field emanating therefrom (i.e. the overlap of the sensitive region and the conductive path).

This determination of the insulation distance may be based on a size of the obstacle, which would influence, for example, the mechanical limitations on placement (installation/integration) of the conductive winding in the PCB. Furthermore, if the obstacle is a conductive path, the size (i.e. size or shape) may influence the electromagnetic properties thereof.

The determination may additionally or alternatively be based on a potential difference between the first conductive winding and the obstacle, as this will influence, for example, the propensity of electrical arcing between the conductive winding and the obstacle.

The determination may additionally or alternatively be based on a potential difference between the first conductive winding and the first conductive path, as this will influence, for example, the propensity of electrical arcing between the conductive winding and the conductive path.

The determination may additionally or alternatively be based on a potential difference between the first conductive path and the obstacle, as this will influence, for example, the propensity of electrical arcing between the conductive path and the obstacle.

Additionally or alternatively, the determination of the insulation may be based on a material of which an insulation material consists. For example, if an insulation material (i.e. a material providing insulation along the insulation distance) has good insulation properties, the insulation distance may be reduced. This allows the current sensor to be even more compact in its construction.

Figure 6:
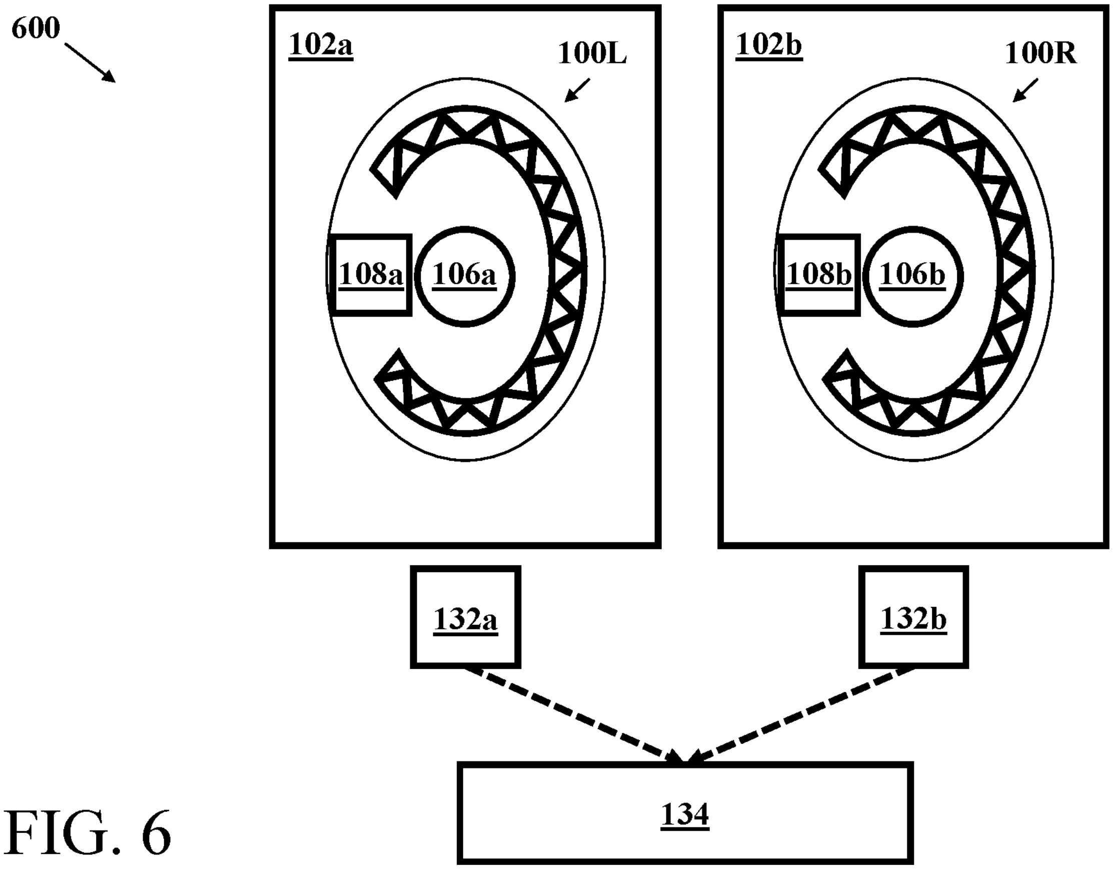
FIG. 6 schematically shows a system comprising current sensors and a signal processing module, according to an embodiment of the present disclosure.

FIG. 6 schematically shows a system 600 comprising current sensors 100L and 100R and a signal processing module 134, according to an embodiment.

As shown in FIG. 6, there is a first current sensor 100L integrated into a first PCB 102*a* for sensing a first current flow through a first conductive path 106*a* located proximate to a first obstacle 108*a*. This current sensor 100L may be the same or similar to those discussed above. The system 600 further comprises a second current sensor 100R integrated into a second PCB 102*b* for sensing a second current flow through a second conductive path 106*b* located proximate to a second obstacle 108*b*. FIG. 6 is not intended to show the physical arrangement of the PCBs 102*a* and 102*b*, as the physical arrangement can be general as discussed above related to FIG. 3.

The first current sensor 100L outputs a first sensor signal, represented as block 132*a*, and the second current sensor 100R outputs a second sensor signal, represented as block 132*b*.

The illustrated system further comprises a signal processing module 134 for processing the sensor signals 132*a* and 132*b* from the first current sensor 100L and the second current sensor 100R.

The signal processing module 134 is configured to generate a current measurement for the first current flow (i.e. the flow through the conductive path 106*a*) based at least in part on a sensor signal from the second current sensor 100R.

Therefore, magnetic flux emanating from the first conductive path 106*a* can be collected by the conductive windings of the first current sensor 100L and the second current sensor 100R and used for contributing to the current measurement generated by the signal processing module 134 for the current flow through the first conductive path 106*a*. In general, the current sensor 100R may be one or multiple current sensors, all which are controlled according to known control signals. The first current flow (i.e. the flow through the conductive path 106*a*) may be based at least in part on sensor signals from one or multiple of these current sensors, as exemplified with current sensor 100R.

In some examples, the known control signals may also be used in generating a current measurement for the first current flow. That is, a control signal for the second current flow through the second conductive path 106*b* may indicate that the second current flow has paused, and this may be used to determine that the measured current flow for the first conductive path 106*a*, from the first current sensor 100L, is not unduly influenced by contributions from the nearby current flow through 106*b*. In a similar way, the influence from the second current flow may be estimated based on the control signals and thereby accounted for by the signal processing module 134 when generating a current measurement for the first current flow.

Figure 7:
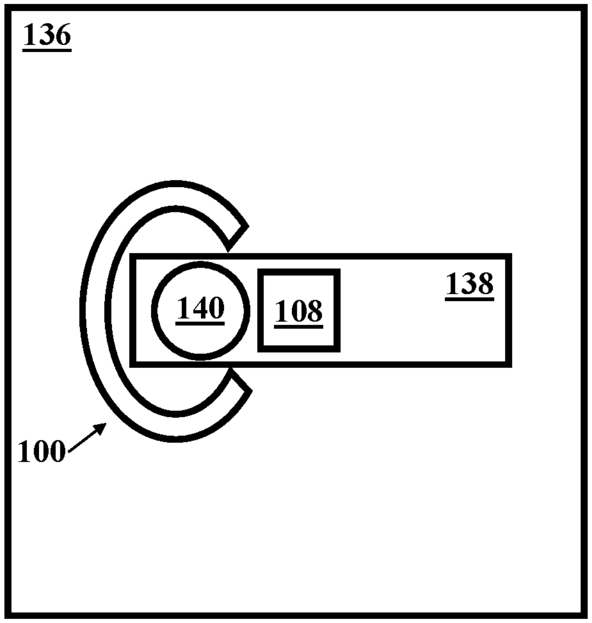
FIG. 7 schematically shows a motor converter for a rail vehicle driveline, according to an embodiment of the present disclosure.

FIG. 7 schematically shows a motor converter 136 for a rail vehicle driveline, according to an embodiment.

The motor converter 136 may have a transistor 138, e.g., for controlling operation of the motor converter 136. The transistor 138 has a pin 140 which has a current sensor 100, the same as or similar to the current sensors described in the foregoing description, arranged for sensing a current flow through the pin 140 of the transistor 138.

The transistor 138 may have pins such as a drain or source pin (or collector, emitter or similar, depending on type of transistor). As an example, the current sensor 100 may measure the current through the drain pin (which then is the conductive path as discussed above) and the source pin may then be thought of as an obstacle in the sense of the obstacle 108 described in the foregoing description. Thus, the current sensor 100 may be arranged to measure the current through the drain pin 140 (which carries the main current of the transistor 138) but also be spaced from the other pins of the transistor 138.

As transistors are packed closer together as the technology advances, the present invention may advantageously provide a measure of the currents in increasingly compact electronic environments, whilst retaining the advantages of high accuracy, high bandwidth, and resistance to interference discussed above.

It will be appreciated that, unless explicitly stated otherwise, the examples shown in different figures may be combined, and elements having like reference numerals in different figures may be the same or similar to each other. In any event, it is intended that the foregoing description not be limiting upon the scope of the invention, and that the invention be defined only by the scope of the following claims.

The invention claimed is:

1. A current sensor integrated into a printed circuit board (PCB) for sensing a current flow through a first conductive path, comprising:

a first conductive winding forming an open shape in a plane of the PCB, wherein:

the open shape has a first end and a second end and delimits a sensitive region in the plane of the PCB for sensing the current flow through the first conductive path arranged within the sensitive region;

the first conductive winding is formed of a conductor having a plurality of turns extending across a thickness of the PCB; and the first conductive winding is spaced from an obstacle in the PCB by at least a distance from the first end to the obstacle.

2. The current sensor according to claim 1, wherein:

the open shape is an elliptical arc, a circular arc, an arc having a U-shape, or an open polygon.

3. The current sensor according to claim 1, wherein:

the distance from the first end to the obstacle is equal to the distance from the second end to the obstacle.

4. The current sensor according to claim 1, wherein:

insultation along the distance from the first end to the obstacle is provided by at least one of:

PCB material, air, or insulation material, arranged between the first conductive winding and the obstacle.

5. The current sensor according to claim 1, wherein:

the plurality of turns is comprised within a range of 4 to 100 turns.

6. The current sensor according to claim 1, wherein:

the first conductive winding is electrically connected to an integrator for generating an output voltage signal indicative of the current flow in the first conductive path.

7. The current sensor according to claim 1, wherein:

the obstacle is a second conductive path having an electrical potential different from the electrical potential of the first conductive path; and the distance from the first end to the obstacle corresponds to a distance from the second conductive path for preventing electrical interference between the second conductive path and the first conductive winding.

8. The current sensor according to claim 7, wherein:

the first end and the second end define an opening axis passing through the first end and the second end, and a midpoint on the opening axis between the first end and the second end; and the first end and the second end are arranged relative to the second conductive path such that an axis perpendicular to the opening axis and passing through the midpoint coincides with a location of the second conductive path.

9. The current sensor according to claim 1, wherein:

the conductor comprises a first electrical terminal and a second electrical terminal; and the first electrical terminal and the second electrical terminal are arranged together at the first end or the second end.

10. The current sensor according to claim 9, further comprising:

a shielding material arranged at least partially shielding the first conductive winding from an electromagnetic source other than the current flow in the first conductive path.

11. The current sensor according to claim 10, wherein:

the shielding material forms at least part of an electrical return from the first electrical terminal to the second electrical terminal.

12. The current sensor according to claim 1, wherein:

the first conductive path consists of a pin of an electronic device.

13. The current sensor according to claim 12, wherein: the electronic device is a semiconductor transistor; and the semiconductor transistor is one of a silicon transistor, a silicon carbide transistor or a high-power semiconductor transistor.

14. A motor converter for a rail vehicle driveline, the motor converter comprising:
one or more transistors, each having at least one pin; and
at least one current sensor according to claim 1 arranged for sensing a current flow through the at least one pin of said one or more transistors.

15. A method for integrating a current sensor into a printed circuit board (PCB) for sensing a current flow through a first conductive path, the method comprising:
arranging a first conductive winding into an open shape in a plane of the PCB, wherein:
the open shape has a first end and a second end and defines a sensitive region in the plane of the PCB for sensing the current flow through the first conductive path arranged within the sensitive region;
the first conductive winding is formed of a conductor having a plurality of turns extending across a thickness of the PCB; and
the first conductive winding is spaced from an obstacle in the PCB by at least a distance from the first end to the obstacle.

16. The method according to claim 15, further comprising:
determining, prior to the arranging, the distance, based at least in part on:
a magnitude of the current flow through the first conductive path;
a size of the obstacle;
a potential difference between the first conductive winding and the obstacle;
a potential difference between the first conductive winding and the first conductive path;
a potential difference between the first conductive path and the obstacle; and/or
a material of which an insulation material consists.

17. The method according to claim 15, further comprising:
receiving, from the current sensor, a sensor signal; and
determining, by a signal processing module and based at least in part on the sensor signal, a current measurement for the current flow.

18. A system, comprising:
a first current sensor integrated into a first printed circuit board (PCB) for sensing a first current flow through a first conductive path, the first current sensor comprising:
a first conductive winding forming a first open shape in a plane of the first PCB, wherein:
the first open shape has a first end and a second end and delimits a first sensitive region in the plane of the first PCB for sensing the first current flow through the first conductive path arranged within the first sensitive region;
the first conductive winding is formed of a first conductor having a plurality of turns extending across a thickness of the first PCB; and
the first conductive winding is spaced from a first obstacle in the first PCB by at least a distance from the first end of the first open shape to the first obstacle;
a second current sensor integrated into a second PCB for sensing a second current flow through a second conductive path, the second current sensor comprising:
a second conductive winding forming a second open shape in a plane of the second PCB, wherein:
the second open shape has a first end and a second end and delimits a second sensitive region in the plane of the second PCB for sensing the second current flow through the second conductive path arranged within the second sensitive region;
the second conductive winding is formed of a second conductor having a plurality of turns extending across a thickness of the second PCB; and
the second conductive winding is spaced from a second obstacle in the second PCB by at least a distance from the first end of the second open shape to the second obstacle; and
a signal processing module for processing sensor signals from the first current sensor and the second current sensor, wherein:
the signal processing module is configured to generate a current measurement for the first current flow based at least in part on a sensor signal from the second current sensor.

19. The system according to claim 18, wherein:
the first sensitive region of the first current sensor is arranged to collect a first magnetic flux induced by the first current flow and a second magnetic flux induced by the second current flow.

20. The system according to claim 19, wherein:
the second current flow through the second conductive path is controlled according to a control signal; and
the signal processing module is further configured to generate a current measurement for the first current flow based at least in part on the control signal.

21. The system according to claim 18, wherein:
the first obstacle and the second obstacle are a same obstacle.

22. The system according to claim 18, wherein:
the first PCB and the second PCB are portions of a same PCB.

23. The system according to claim 22, wherein:
the first conductive path is a pin of a first electronic device;
the second conductive path is a pin of a second electronic device; and
the first electronic device and the second electronic device are parts of a same electrical circuit on the PCB.

24. The system according to claim 18, wherein:
the first current sensor and the second current sensor are arranged symmetrically.

25. The system according to claim 24, wherein:
the first PCB and the second PCB are arranged in parallel planes, and the first current sensor and the second current sensor are arranged symmetrically about a plane parallel to the first PCB and the second PCB; or
the first PCB and the second PCB are portions of a same PCB, and the first current sensor and the second current sensor are arranged symmetrically about a plane perpendicular to the PCB.

* * * * *